United States Patent [19]

Benzinger

[11] 4,015,224
[45] Mar. 29, 1977

[54] ACTIVE BAND-PASS FILTER
[75] Inventor: Hans Benzinger, Duisburg, Germany
[73] Assignee: Thielscher-Electronic Gerhard Thielscher, Duisburg, Germany
[22] Filed: July 31, 1975
[21] Appl. No.: 600,907
[30] Foreign Application Priority Data
July 31, 1974 Germany .......................... 2436966
[52] U.S. Cl. .............................. 333/70 R; 330/107
[51] Int. Cl.² ...................................... H03F 1/36
[58] Field of Search .......... 330/107, 109; 333/70 R
[56] References Cited
UNITED STATES PATENTS
3,375,451 3/1968 Borelli et al. .................... 333/70 R

OTHER PUBLICATIONS

Deboo & Hedlund "Automatically Tuned Filter Uses IC Operational Amplifiers" Feb., 1972, p. 1.

Primary Examiner—Alfred E. Smith
Assistant Examiner—David K. Moore
Attorney, Agent, or Firm—Karl F. Ross; Herbert Dubno

[57] ABSTRACT

An active band-pass filter comprises at least one unit consisting of two filter sections connected in tandem via capacitive coupling impedances, each section including an operational amplifier with an R/C network in its feedback path. The network has two parallel branches, one of them being divided into two series capacitances whose junction is grounded through a shunt resistance and is also connected to the output of the other section through one of the coupling capacitances acting as a feedback impedance. One of these series capacitances, lying between that junction and the inverting input of the operational amplifier, is also in series with an input impedance which in the case of the first section is a high-ohmic resistor and in the case of the second section is the other coupling capacitance. In a modified unit, constituting the dual of the first one, all the capacitances of the former are replaced by resistances and vice versa.

8 Claims, 4 Drawing Figures

ACTIVE BAND-PASS FILTER

FIELD OF THE INVENTION

My present invention relates to an active band-pass filter designed, for example, to isolate a characteristic signal for the actuation of switching equipment under the control of a remote station.

BACKGROUND OF THE INVENTION

Systems are known in which customers of a centralized utility such as a power plant, for example, receive switching signals designed to modify the operation of a rate meter at certain times, e.g. in the evening for a changeover to a lower night rate and in the morning for a return to the normal day rate. In the case of an electric-power station these signals generally appear as low-amplitude modulations, at a predetermined elevated frequency, of the utility current delivered to the customer at 50 or 60 Hz. Since the waveform of that utility current is rarely a pure sine curve, a highly selective filter is needed to separate such a signal from adjacent harmonics of the basic frequency.

Passive filters, as a class, do not have the necessary selectivity and thermal stability to satisfy the requirements of such a signaling system under diverse ambient conditions. An improvement in selectivity can be realized with the use of purely resistive/capacitive active circuits comprising a pair of relatively detuned filter sections whose coupling factor $k$ is given by $$k = 2 \frac{\omega_2 - \omega_1}{\omega_2 + \omega_1}$$

wherein $\omega_1$ and $\omega_2$ are the natural pulsatances of the two coupled sections. The amplification factor $\alpha$ of such a filter is a function of its coupling factor $k$, as is the damping factor $d$. With filter impedances consisting for example of metal-layer resistors and capacitors of the type marketed under the trademark Styroflex, the resonance frequencies of the individual filter sections are found to vary by as much as ±2.05% in response to temperature variations between −30° and +70° C. With a damping factor $d = 2\%$, a value suitable for signaling systems of the type discussed above, a coupling factor $k$ nominally equal to $d$ will vary between −2.1% and +6.1%. The amplification factor $\alpha$ fluctuates in that instance between 200% ($k = 0$) and 19.4% ($k = 6.1\%$) which, of course, would be intolerable in such a switching system.

OBJECTS OF THE INVENTION

The general object of my present invention, therefore, is to provide an improved band-pass filter which obviates the aforestated drawbacks and is highly selective as well as thermally stable.

A more particular object is to provide a filter of this description benefitting of the inherent advantages of R/C networks, i.e. freedom from self-induced oscillations (the damping factor $d$ having no poles) and a wide choice of bandwidths and transitory periods.

A further object is to provide an active band-pass filter with a large amplification factor, adapted to be used for actuating a binary switch (e.g. a transistor) of any threshold voltage.

SUMMARY OF THE INVENTION

I have found, in accordance with the present invention, that the aforestated objects may be realized if the active band-pass filter includes at least one unit formed from a first and second filter section in tandem, each filter section including an operational amplifier and associated impedances of resistive and capacitive character or type. The tandem connection between the two filter sections is effected by at least one physically realized or lumped coupling impedance included in one of the two groups of associated impedances, i.e. the capacitive group or the resistive group.

In a preferred embodiment, the operational amplifier of each section is provided with a resistive/capacitive network in a feedback path between its output and its inverting input, that network having a capacitive and a resistive branch in parallel. One of these branches includes two series impedances forming a junction therebetween. A shunt impedance connected in each filter section between this junction and a common terminal of the amplifier, generally constituted by a grounded, noninverting input thereof, is of the same type (i.e. resistive or capacitive) as the other (undivided) branch of the network, as is an input impedance connected to the junction of the first filter section. An impedance of the other type, corresponding to that of the divided network branch, is connected between the amplifier output of the first section and the junction of the second section, thereby acting as the aforementioned coupling impedance. Another coupling impedance of like type is advantageously connected, as a feedback capacitance or resistance, between the amplifier output of the second section and the junction of the first section.

Thus, a filtering unit according to my invention can be realized in either of two forms which are the duals of each other, i.e. with resistive input and shunt impedances and capacitive coupling impedances (the divided network branch being then also capacitive) or vice versa. In the first instance, i.e. with capacitive coupling, the ratio of output voltage to input voltage varies within the pass band as a function of $\omega/\omega_0$ where $\omega$ is the signal frequency applied to the input resistance and $\omega_0$ is the midfrequency of the band. In the second instance, i.e. with resistive coupling, the voltage ratio varies as a function of the reciprocal value $\omega_0\omega$. If one such unit and its dual are cascaded with each other to form a four-section filter, the damping factor is increased without change in selectivity so that the resulting circuit responds much more rapidly to the applied signal.

In a band-pass filter according to my invention, as defined above, the presence of an operational amplifier in the last section practically eliminates any effect of the load upon preceding circuits; there will generally be no need for a power amplifier downstream of the filter. The two coupled filter sections provide more damping without reduction of selectivity than a one-section circuit and do not occupy significantly more space than a conventional band-pass filter of the inductive-capacitive type. Even in a single two-section unit, a large damping factor $d$ and consequently a rapid attainment of the steady-state condition can be realized with the aid of critical coupling made possible by the active circuits.

BRIEF DESCRIPTION OF THE DRAWING

The above and other features of my invention will now be described in detail with reference to the accompanying drawing in which.

SPECIFIC DESCRIPTION

Figure 1:
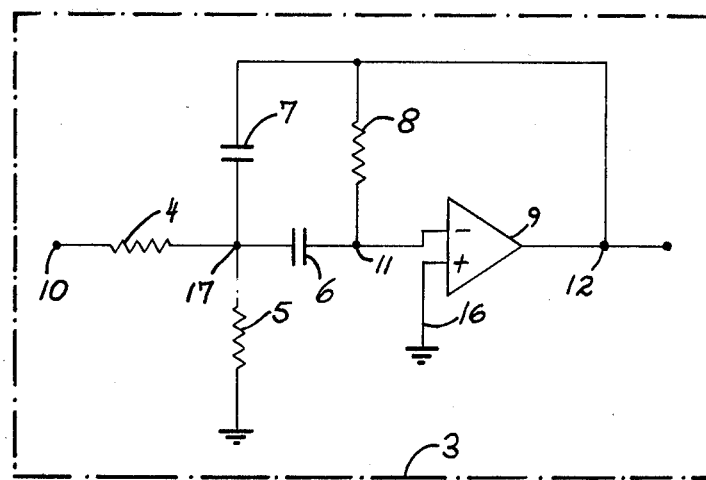
FIG. 1 is a circuit diagram of an active filter section adapted to be included in a band-pass filter according to my invention.

In FIG. 1 I have shown a filter section 3 comprising a differential amplifier 9 with an inverting input 11, an output 12, and a noninverting input 16 constituting a grounded terminal common to the output circuit. A feedback path connected between output 12 and inverting input 11 comprises an R/C network with a resistive branch 8 and a capacitive branch divided into two series capacitors 6 and 7 forming a junction 17 therebetween. A high-ohmic input resistor 4 lies between junction 17 and a terminal 10 adapted to receive the input signal to be selectively amplified. A low-ohmic shunt resistor 5 extends between junction 17 and ground.

Figure 2:
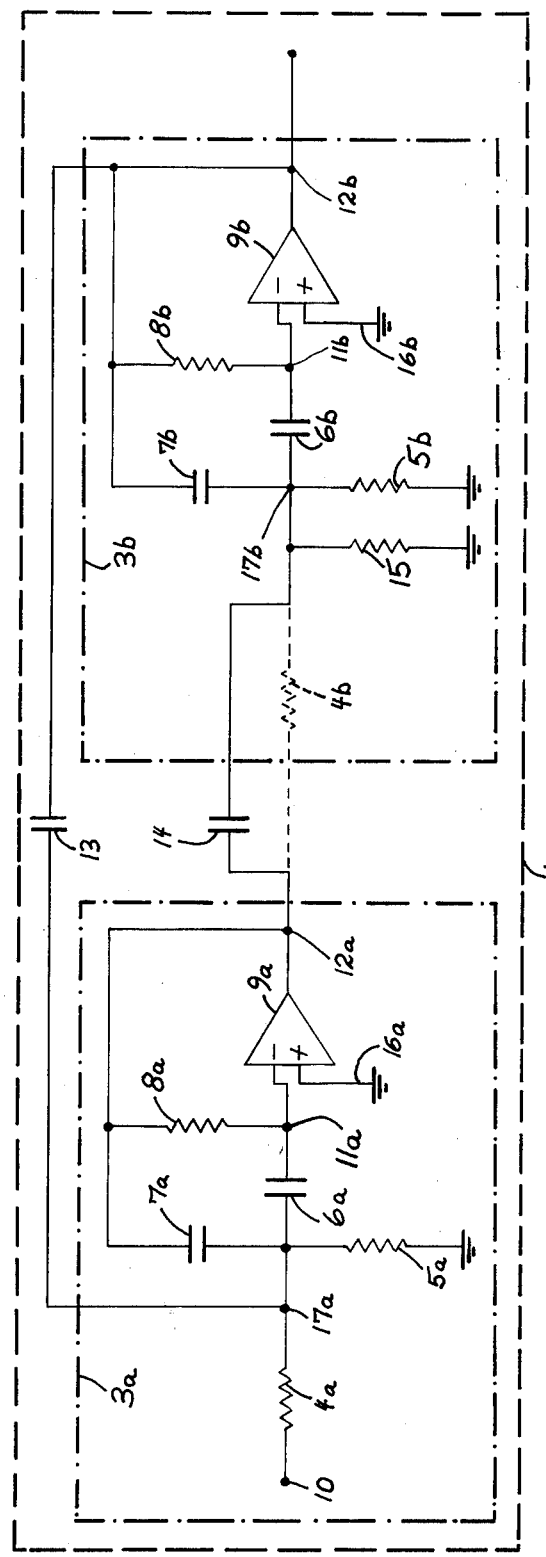
FIG. 2 is a circuit diagram of a two-section filtering unit embodying the invention.

In FIG. 2 I have shown a filtering unit 1 consisting essentially of two sections 3a, 3b of the type illustrated in FIG. 1, corresponding components have been designated by the same reference numerals followed by the postscript a or b, respectively. The two sections 3a and 3b are interconnected by a pair of coupling condensors 13 and 14, condenser 13 being of relatively small capacitance and lying in a feedback circuit between output 12b and junction 17a whereas condenser 14, of relatively large capacitance, lies in a forward path between output 12a and junction 17b. As indicated in dotted lines, coupling condenser 14 may shunt a high-ohmic input resistor 4b of the second section 3b; this, however, would yield a complex overall coupling factor k. The undesirable real component of this coupling factor may be eliminated by giving this resistor 4b a value of ∞, i.e. by open-circuiting the connection which parallels the capacitor 14. If, for the sake of simplification, impedances 5a, 6a and 7a are respectively equal to impedances 5b, 6b and 7b (resistance 8a differing from resistance 8b in order to provide unequal time constants for the feedback networks of the two sections), the elimination of resistor 4b may be compensated by connecting another resistor 15 in shunt with resistor 5b. Naturally, the combination of resistors 15 and 5b is the equivalent of a single shunt resistor of reduced magnitude.

The overall coupling factor k for the unit 1 of FIG. 2 is given by $$k = \sqrt{k_1 \cdot k_2}$$

where $k_1$ and $k_2$ represent the coupling factors due to capacitors 13 and 14, respectively. These individual factors may be expressed by $$k_1 = C_{13}/C_{7a}$$

and $$k_2 = C_{14}/C_{7b},$$

whence $$k = \sqrt{\frac{C_{13} C_{14}}{C_{7a} C_{7b}}},$$

the parameters $C_{7a}$, $C_{7b}$, $C_{13}$, $C_{14}$ being the capacitances of condensers 7a, 7b, 13 and 14, respectively. Coupling factor k, accordingly, has a real value expressed as a ratio of capacitances. (In the dual 1' of the unit 1, described hereinafter with reference to FIG. 3, this value is a resistance ratio.)

Capacitors 6a and 7a (and therefore also 6b and 7b) are advantageously equal to each other.

By way of example I shall now list specific values for the impedances used in the filtering unit 1 of FIG. 2, designed to respond to a signal of 183⅓ Hz superimposed upon a 50-Hz mains current rich in higher harmonics. In the actual case referred to, the third harmonic (150 Hz) and the fourth harmonic (200 Hz) had maximum amplitudes of 12% and 1.5%, respectively, of the nominal net voltage which was stepped down to 12 V on input terminal 10. The signal amplitude amounted to 0.4% of the nominal net voltage; the required damping was 5%.

| Capacitances: | $C_{6a} = C_{7a} = C_{6b} = 6_{7b} = 100$ nf |
| --- | --- |
| | $C_{13} = 208$ pf |
| | $C_{14} = 120$ nf |
| Resistances: | $R_{4a} = 3.241$ MΩ |
| | $R_{5a} = R_{5b} = 216.8$ Ω ⎫ $R_{5b} + R_{15} = 135.6$ Ω |
| | $R_{15} = 362$ Ω |
| | $R_{8a} = 347.6$ kΩ |
| | $R_{8b} = 555.6$ kΩ |

($R_{4a}$, $R_{5a}$, $R_{5b}$, $R_{8a}$, $R_{8b}$ and $R_{15}$ are, of course, the resistances of the correspondingly designated impedance elements in FIG. 2.)

From the foregoing values it is possible to calculate the coupling factors as $$K_1 = 0.00208,$$

$$k_2 = 1.2$$

$$k = 0.05 = 5\% = d.$$

The described filter was effective in extracting the desired signal despite the presence of the dominant third and fourth harmonics bracketing its frequency of 183⅓ Hz.

Figure 3:
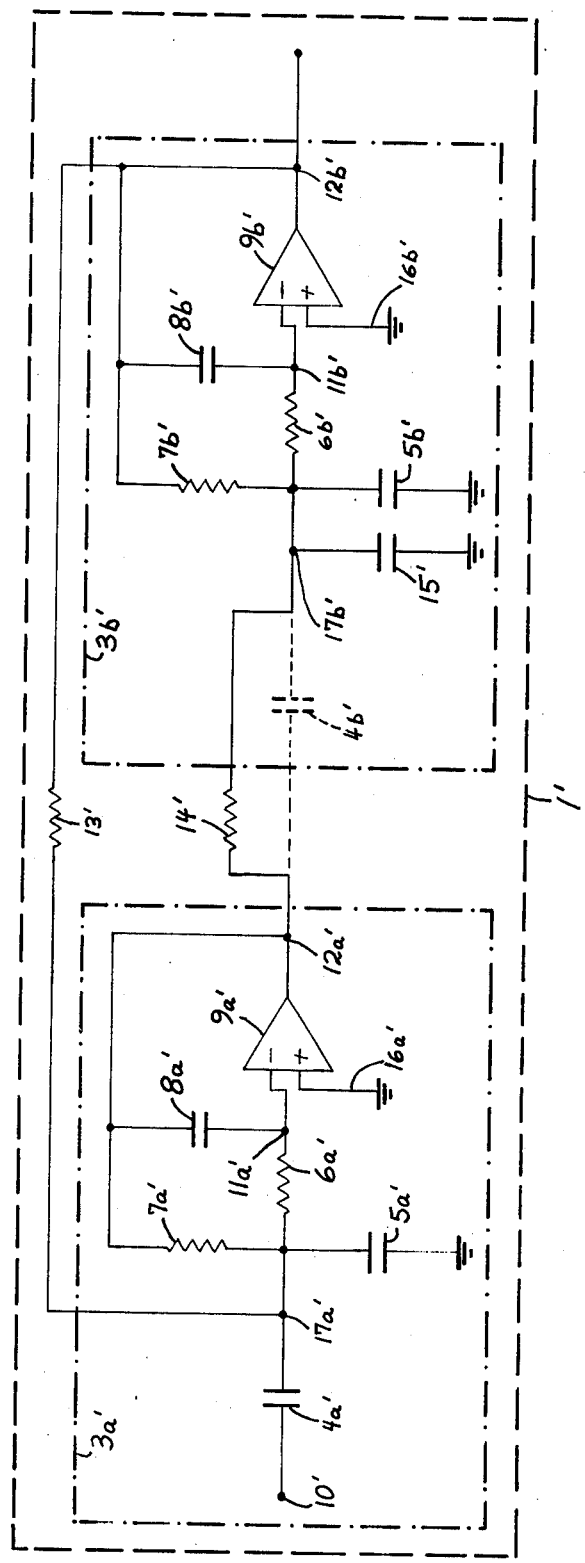
FIG. 3 is a circuit diagram showing the dual of the filtering unit illustrated in FIG. 2.

The modified filter unit 1' shown in FIG. 3, representing the dual of unit 1 as defined above, comprises two coupled sections 3a', 3b' with capacitors 4a', 5a', 5b', 8a', 8b' and 15b' in lieu of the corresponding resistors in FIG. 2 (a second input capacitor 4b', indicated in dotted lines, being suppressed like resistor 4b) and resistors 6a', 6b', 7a', 7b', 13' and 14' replacing the corresponding capacitors. Terminals 10', 11a', 11b', 12a', 12b', 16a' and 16b' as well as junctions 17a', 17b' have the same significance as their unprimed counterparts in FIG. 2.

Figure 4:
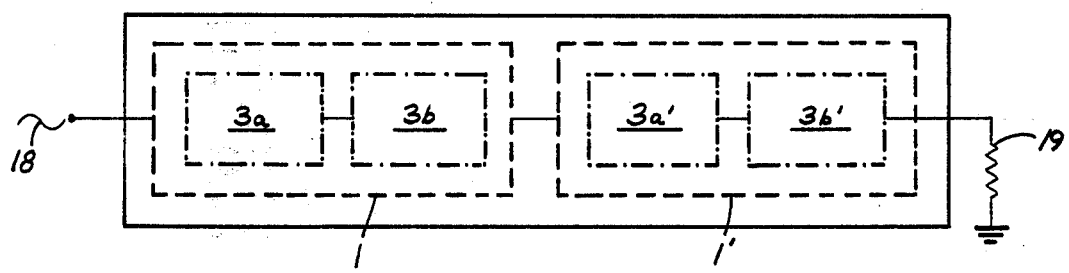
FIG. 4 is a block diagram of a four-section filter consisting of two cascaded units as illustrated in FIGS. 2 and 3, respectively.

FIG. 4 shows the units 1 and 1' of FIGS. 2 and 3 connected in cascade between a signal source 18 and a load 19. It will be evident, however, that the two cascaded units need not necessarily be complementary (though this has the aforedescribed advantage of accelerated steady-state establishment) and that more than two units could be so interconnected if higher requirements are to be satisfied.

I claim:

1. An active band-pass filter comprising at least one unit formed from a first and second filter section in tandem, each of said sections including an operational amplifier with an inverting input, a common terminal and an output, said operational amplifier being provided with a resistive/capacitive feedback network having two parallel impedance branches connected between said output and said inverting input, one of said branches being divided into two series impedances of a first type forming a junction therebetween, the other of said branches being an impedance of a second type, one of said types being resistive, the other of said types being capacitive, each of said sections further including a shunt impedance of said second type connected between said junction and said common terminal; an input impedance of said second type connected to said junction of said first section; a coupling impedance of said first type connected between said output of said first section and said junction of said second section; and a feedback impedance of said first type connected between said output of said second section and said junction of said first section.

2. A band-pass filter as defined in claim 1 wherein said series impedances are of substantially the same magnitude.

3. A band-pass filter as defined in claim 2 wherein the magnitude of said series impedances is substantially the same in said first and second sections, the magnitude of said shunt impedance in said second section being substantially less than in said first section.

4. A band-pass filter as defined in claim 3 wherein said input impedance, said shunt impedance and the impedance of said other of said branches are resistive, said series impedances, coupling impedance and feedback impedance being capactive.

5. A band-pass filter as defined in claim 4 wherein said feedback impedance has a substantially lower capacitance than said coupling impedance.

6. A band-pass filter as defined in claim 4 wherein said input impedance has a substantially higher resistance than said shunt impedance and the impedance of said other of said branches.

7. A band-pass filter comprising a plurality of cascaded units as defined in claim 1.

8. A band-pass filter as defined in claim 7 wherein the impedance of said first type are capacitive in one of said cascaded units and in another of said cascaded units.

* * * * *